US009310401B2

(12) United States Patent
Tsao et al.

(10) Patent No.: US 9,310,401 B2
(45) Date of Patent: Apr. 12, 2016

(54) POWER MONITORING DEVICE FOR IDENTIFYING STATE OF ELECTRIC APPLIANCE AND POWER MONITORING METHOD THEREOF

(75) Inventors: Shiao-Li Tsao, Taipei (TW); Yi-Sheng Lai, Taichung (TW); Ming-Chun Lin, Keelung (TW); Yung-Chi Chen, Taichung (TW)

(73) Assignee: National Chiao Tung University, Hsinchu (TW)

( * ) Notice: Subject to any disclaimer, the term of this patent is extended or adjusted under 35 U.S.C. 154(b) by 1260 days.

(21) Appl. No.: 13/169,056

(22) Filed: Jun. 27, 2011

(65) Prior Publication Data

US 2012/0004871 A1 Jan. 5, 2012

(30) Foreign Application Priority Data

Jul. 2, 2010 (TW) .............................. 99121853 A

(51) Int. Cl.
*G01R 21/00* (2006.01)
*G01R 19/25* (2006.01)

(52) U.S. Cl.
CPC .................................. *G01R 19/2513* (2013.01)

(58) Field of Classification Search
CPC ............... G01R 22/00; G01R 19/2513; H04B 2203/5433; G06Q 50/06
USPC .................. 700/291, 295; 702/60–64, 6, 776; 6/291, 295
See application file for complete search history.

(56) References Cited

U.S. PATENT DOCUMENTS 4,365,302 A 12/1982 Elms
4,694,402 A 9/1987 McEachern et al.
(Continued)

FOREIGN PATENT DOCUMENTS

CN 1645711 7/2005
CN 101458267 6/2009
(Continued)

OTHER PUBLICATIONS

Roos et al., "Using Neural Networks for Non-intrusive Monitoring Electrical Loads", 1994, IEEE, IMTC '94, p. 1115-1117.*
(Continued)

*Primary Examiner* — Sujoy Kundu
*Assistant Examiner* — Ricky Ngon
(74) *Attorney, Agent, or Firm* — Jianq Chyun IP Office

(57) ABSTRACT

A power monitoring device for identifying the state of an electric appliance based on user feedbacks and a power monitoring method thereof are provided. The power monitoring device includes a measurement module, a variation detection and search module, and an electric appliance signature database established based on user feedbacks. When the measurement module detects a variation of a power consumption feature, the variation detection and search module searches the electric appliance signature database according to the variation to obtain electric appliances similar to the variation and the states thereof. A user contributes data to the electric appliance signature database by confirming the search result, or selecting the correct electric appliance and the state thereof. When the user confirms the search result, the power monitoring device establishes an association between the electric appliance and its electric appliance signatures and updates the electric appliance signature database.

14 Claims, 14 Drawing Sheets

(56) References Cited

U.S. PATENT DOCUMENTS

| | | | |
|---|---|---|---|
| 4,858,141 A | | 8/1989 | Hart et al. |
| 4,979,122 A | | 12/1990 | Davis et al. |
| 5,122,735 A | | 6/1992 | Porter et al. |
| 5,248,967 A | | 9/1993 | Daneshfar |
| 5,276,629 A | | 1/1994 | Reynolds |
| 5,400,261 A | | 3/1995 | Reynolds |
| 5,483,153 A | | 1/1996 | Leeb et al. |
| 5,717,325 A | | 2/1998 | Leeb et al. |
| 5,963,457 A | * | 10/1999 | Kanoi et al. ............... 700/291 |
| 7,068,184 B2 | | 6/2006 | Yee et al. |
| 2003/0093390 A1 | * | 5/2003 | Onoda et al. ............... 705/412 |
| 2003/0097348 A1 | | 5/2003 | Cao |
| 2004/0063405 A1 | * | 4/2004 | Song ........................... 455/41.2 |
| 2007/0133598 A1 | * | 6/2007 | Moran ......................... 370/466 |
| 2009/0174569 A1 | * | 7/2009 | Smith et al. ............. 340/825.49 |
| 2009/0189774 A1 | * | 7/2009 | Brundridge et al. .......... 340/654 |
| 2009/0195349 A1 | * | 8/2009 | Frader-Thompson et al. 340/3.1 |
| 2009/0207753 A1 | * | 8/2009 | Bieganski ..................... 370/254 |
| 2009/0307178 A1 | * | 12/2009 | Kuhns et al. ................... 706/54 |
| 2010/0156649 A1 | * | 6/2010 | Deaver et al. ................. 340/646 |
| 2010/0238003 A1 | * | 9/2010 | Chan et al. ............. 340/310.11 |
| 2013/0158911 A1 | * | 6/2013 | Young et al. ................... 702/62 |
| 2013/0238266 A1 | * | 9/2013 | Savvides et al. ............... 702/61 |

FOREIGN PATENT DOCUMENTS

| | | |
|---|---|---|
| JP | 2004-317441 | 11/2004 |
| JP | 2009-047694 | 3/2009 |
| KR | 10-2008-0114143 | 12/2008 |
| TW | 200742969 | 11/2007 |
| TW | M348951 | 1/2009 |
| TW | 201022923 | 6/2010 |

OTHER PUBLICATIONS

Inoue et al., "Network Architecture for Home Energy Management System", Aug. 2003, IEEE Transactions on Consumer Electronics, vol. 49, No. 3.*

Michael Roche, "Time Synchronization in Wireless Networks", Apr. 23, 2006, http://www.cs.wustl.edu/~jain/cse574-06/ftp/time_sync/index.html.*

"Office Action of Taiwan counterpart application" issued on Apr. 8, 2013, p. 1-p. 7.

Roos, J.G. et al., "Using Neural Networks for Non-intrusive Monitoring of Industrial Electrical Loads," Conference Proceedings of Instrumentation and Measurement Technology Conference, IMTC'94. vol. 3, IEEE, May 10-12, 1994, pp. 1115-1118.

"Office Action of Japan Counterpart Application", issued on Jan. 22, 2013, p. 1-p. 5.

* cited by examiner

POWER MONITORING DEVICE FOR IDENTIFYING STATE OF ELECTRIC APPLIANCE AND POWER MONITORING METHOD THEREOF

CROSS-REFERENCE TO RELATED APPLICATION

This application claims the priority benefit of Taiwan application serial no. 99121853, filed on Jul. 2, 2010. The entirety of the above-mentioned patent application is hereby incorporated by reference herein and made a part of this specification.

BACKGROUND OF THE INVENTION

1. Field of the Invention

The invention generally relates to a power measurement and monitoring technique, and more particularly, to a power monitoring technique for identifying the state of an electric appliance based on the feedbacks from users, such that the user can understand the power consumption of individual appliances conveniently.

2. Description of Related Art

Power monitoring devices (also referred to as electricity meters) are devices used for measuring and monitoring power consumptions of residential and industrial areas or electric appliances. A power company can sell electric power based on the power consumption information shown on an electricity meter, and a user can install an electricity meter at the main power supply or a power supply in his/her house or company to monitor the power consumption.

In recent years, energy saving and carbon reduction have become a hot topic in our society. Most electricity meters currently used by power companies are mechanical meters that can only display the total power consumption information of a house or building but cannot provide real-time power consumption at specific time or period. Thus, in many countries around the world, digital smart electricity meters (or smart meters in short) are being enthusiastically promoted for the construction of smart power supply networks (or smart grids in short). A smart meter can report the real-time power consumption to users and electric utility company. An electric utility company can further predict or manage the residential and industrial power consumptions during peak hours. To a user, a smart meter allows the user to understand the power consumption situation of his/her house, building or company at any time and can turn off those unused electric appliances to reduce electricity cost.

Taking household electricity consumption as an example, a conventional smart meter is usually installed at the main power supply in a house or a building. Thus, the user can only monitor the main power supply and obtain the power consumption information of the main power supply but not the detailed power consumption information of each electric appliance in his/her house or building. According to research results, 25% to 30% power consumption can be reduced if users are able to know the power consumption situation of each electric appliance in their houses or companies. Therefore, smart meter may integrate nonintrusive load monitoring (NILM) technique so that detailed power consumption information of individual appliances can be provided. However, smart meter with NILM feature may not be able to correctly detect different types of electric appliances due to the difficulty in collecting the power consumption feature data for a large amount of different appliances and new models. Besides, it is impossible to compare the power consumptions of the same electric appliance or different electric appliances having the same function in different places, houses, and building or to understand the efficiency of an electric appliance or determine the power consumption cause. As a result, the conventional smart meter may not be able to help users to understand the power consumption situation of each electric appliance in his/her house, manage the electric appliances with high power consumptions, determine the power consumption cause, or draw up a power-saving plan effectively.

If a user wants to monitor the power consumed by each electric appliance in his/her house and accordingly determines the power consumption cause, another solution is to attach a power consumption monitoring device or sensor similar to a smart meter to each electrical outlet in the user's house. A user may not be willing to install the power monitoring system described above since the user has to install a large number of power consumption monitoring device or sensors to every electrical outlet and spend cost and effort for the installation.

SUMMARY OF THE INVENTION

The invention is directed to a power monitoring device for identifying the state of an electric appliance based on user feedbacks and a power monitoring method therefor. The power monitoring device searches an electric appliance signature database according to variation of power consumption features to find candidate electric appliances and states of the electric appliances. Meanwhile, a user contributes data to the electric appliance signature database by confirming the search result, or selecting a correct electric appliance (or a set of correct electric appliances) from the candidate electric appliances, or providing the correct electric appliance(s) by his/her own self. A power consumption feature of the electric appliance confirmed by the user and the corresponding information are used for updating the electric appliance signature database. In other words, associations between electric appliances, states of the electric appliances, and power consumption features of the electric appliances (i.e., an electric appliance signature database) are established based on user feedbacks. Therefore, an electric appliance and the state of the electric appliance are identified according to the electric appliance signature database, and the user can understand the efficiency and power consumption cause of a currently used electric appliance in comparison with other same electric appliances or other electric appliances with the same functions. This function can be achieved by recording the power consumption of the electric appliances and comparing the power consumption features of other electric appliances. The invention helps user in drawing up a power-saving plan and reducing power consumption effectively.

The invention provides a power monitoring device for identifying the state of an electric appliance based on user feedbacks. The power monitoring device includes a measurement module, a variation detection and search module, and an electric appliance signature database established based on user feedbacks. The measurement module measures a power consumption feature of a power supply, wherein the power supply supplies electric power to a plurality of electric appliances. The variation detection and search module is coupled to the measurement module, and which detects and calculates a variation of the power consumption feature. When the variation is detected, the variation detection and search module searches the electric appliance signature database according to the variation to obtain one or more candidate electric appliances similar to the variation and states of the electric appliances or a combination of a plurality of candidate electric appliance states. Meanwhile, a user contributes data to the electric appliance signature database by confirming the search result, or selecting a correct electric appliance (or a set of correct electric appliances) among the candidate electric appliances, or providing the correct electric appliance(s) by his/her own self. A power consumption feature of the electric appliance confirmed by the user and the corresponding information are used for updating the electric appliance signature database. According to an embodiment of the invention, the measurement module includes a filter unit and a power consumption feature measurement unit. The filter unit measures the power consumption feature of the power supply and filters out noises in the power consumption feature. The power consumption feature measurement unit is coupled to the filter unit, and which samples the power consumption feature to obtain a characteristic parameter list of the power consumption feature.

According to an embodiment of the invention, the variation detection and search module includes a memory unit and a search unit. The memory unit stores the complete or partial electric appliance signature database. The search unit is coupled to the memory unit, and which detects and calculates a variation characteristic parameter list of the variation according to the characteristic parameter list of the power consumption feature and a previous characteristic parameter list of the power consumption feature. When the variation is greater than a threshold, the search unit searches the electric appliance signature database according to the variation characteristic parameter list to obtain one or more candidate electric appliances similar to the variation and states of the electric appliances or a combination of a plurality of candidate electric appliance states. Meanwhile, the user contributes data to the electric appliance signature database by confirming the search result, or selecting a correct electric appliance (or a set of correct electric appliances) among the candidate electric appliances, or providing the correct electric appliance(s) by his/her own self. A power consumption feature of the electric appliance confirmed by the user and the corresponding information are used for updating the electric appliance signature database.

According to an embodiment of the invention, the variation detection and search module includes a variation detection unit, a transmission interface unit, and a search module. The variation detection unit detects and calculates the variation characteristic parameter list of the variation according to the characteristic parameter list of the power consumption feature and the previous characteristic parameter list of the power consumption feature. When the variation is greater than the threshold, the variation detection unit generates a variation signature packet, wherein the variation signature packet contains the variation characteristic parameter list. The transmission interface unit is coupled to the variation detection unit, and which transmits the variation signature packet via a network transmission path. The search module receives the variation signature packet via the network transmission path and searches the electric appliance signature database according to the variation characteristic parameter list in the variation signature packet, so as to obtain one or more candidate electric appliances similar to the variation and states of the electric appliances or a combination of a plurality of candidate electric appliance states.

Meanwhile, the user contributes data to the electric appliance signature database by confirming the search result, or selecting a correct electric appliance (or a set of correct electric appliances) among the candidate electric appliances, or providing the correct electric appliance(s) by his/her own self. A power consumption feature of the electric appliance confirmed by the user and the corresponding information are used for updating the electric appliance signature database.

The invention provides a power monitoring method for identifying the state of an electric appliance based on user feedbacks. The power monitoring method includes following steps. A power consumption feature of a power supply is measured and sampled, wherein the power supply supplies electric power to a plurality of electric appliances. A variation of the power consumption feature is detected and calculated. When the variation is detected, an electric appliance signature database is searched according to the variation to obtain one or more candidate electric appliances similar to the variation and states of the electric appliances or a combination of a plurality of candidate electric appliance states.

Meanwhile, a user contributes data to the electric appliance signature database by confirming the search result, or selecting a correct electric appliance (or a set of correct electric appliances) among the candidate electric appliances, or providing the correct electric appliance(s) by his/her own self. A power consumption feature of the electric appliance confirmed by the user and the corresponding information are used for updating the electric appliance signature database.

According to an embodiment of the invention, the step of searching the electric appliance signature database according to the variation includes following steps. A Fourier transform is performed on a variable current wave in a variation characteristic parameter list to obtain a comparison of harmonic wave information. The electric appliance signature database is searched according to a current variation, current harmonic wave information, active power, reactive power, and a transient current wave produced when an electric appliance switches states to obtain one or more candidate electric appliances similar to the variation and states of the electric appliances or a combination of a plurality of candidate electric appliance states.

As described above, in an embodiment of the invention, when the state of an electric appliance changes, a corresponding variation of the power consumption feature of the electric appliance is produced. Accordingly, associations between electric appliances, states of the electric appliances, and variations of the power consumption features of the electric appliances (i.e., an electric appliance signature database) are established with user feedbacks. Then, in an embodiment of the invention, the electric appliance signature database is searched according to a variation of a power consumption feature (for example, voltage, current, or power) of a monitored power supply, so as to identify an electric appliance and the state thereof. Thereby, a power monitoring device can record the power consumption of each electric appliance according to the variation of the state of the electric appliance, and accordingly a user can conveniently determine the power consumption cause and reduce the power consumption.

Additionally, in an embodiment of the invention, a large electric appliance signature database and a highly efficient database searching capability are provided through the Internet and the cloud computing technology such that a user can record the brand, model, power consumption cause, and power-saving suggestions of his/her electric appliances into the electric appliance signature database. Accordingly, such functions as a more specific power saving and management plan, automatic power consumption cause judgment, power consumption distribution analysis, and automatic power saving control can be achieved.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
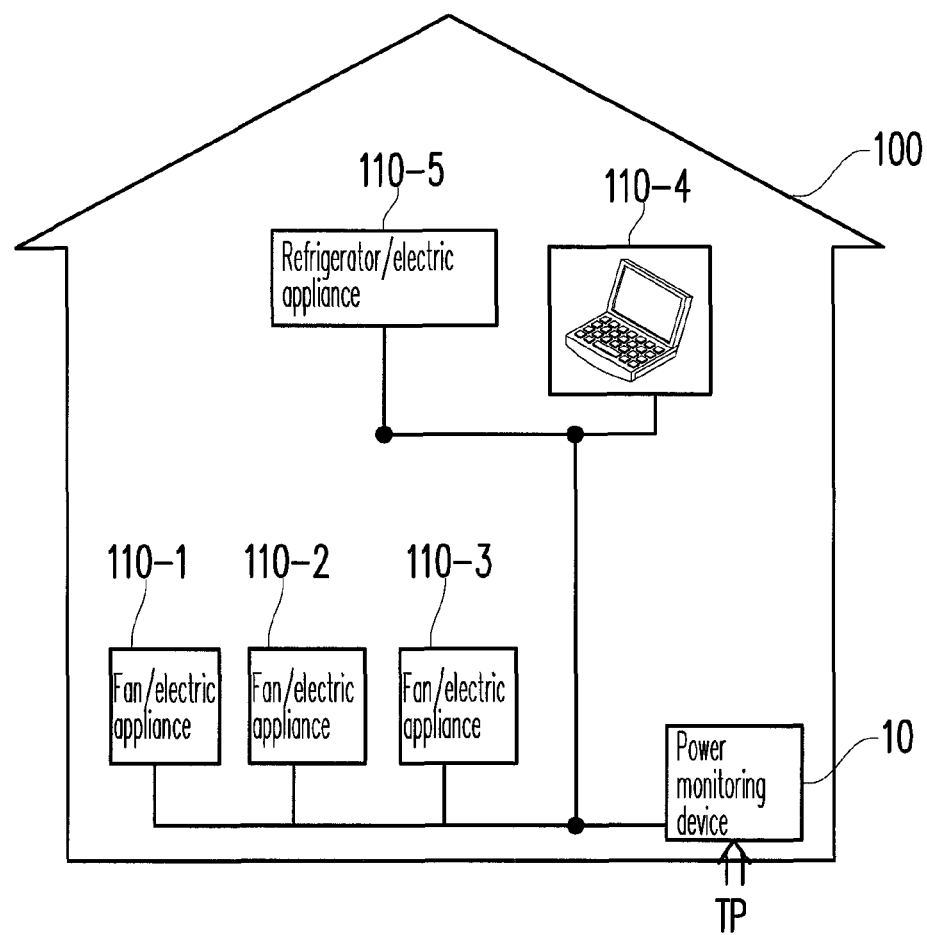
FIG. 1 is a diagram of a power monitoring device for identifying the state of an electric appliance according to a first embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a diagram of a power monitoring device 10 for identifying the state of an electric appliance based on user feedbacks according to a first embodiment of the invention. In the present embodiment, a household AC main power supply TP is monitored. However, the invention is not limited thereto, and in other embodiments, the power monitoring device 10 may be adopted by an enterprise or a power company for power supply management or used for monitoring any power supply. Referring to FIG. 1, there is a plurality of electric appliances 110-1-110-N in a building 100, wherein N is a positive integer greater than 1. For the convenience of description, in the present embodiment, N is set to 5, and the power monitoring device 10 can monitor at most 30 to 50 electric appliances or an AC of about 100 amp. However, the invention is not limited thereto. The main power supply TP supplies electric power to the electric appliances 110-1-110-5.

Figure 2:
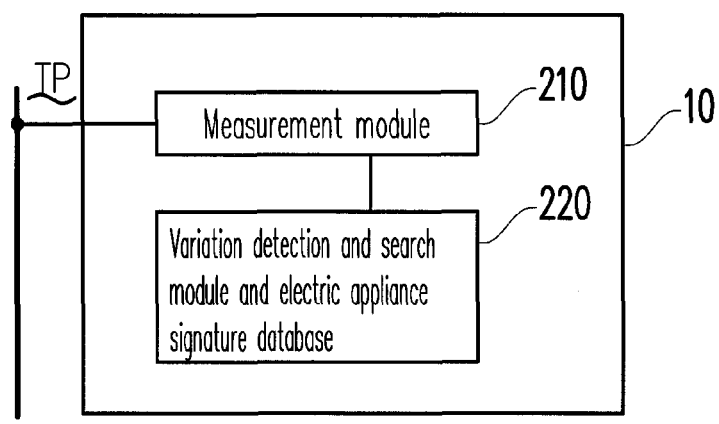
FIG. 2 is a block diagram of a power monitoring device for identifying the state of an electric appliance according to the first embodiment of the invention.

In the present embodiment, the power monitoring device 10 obtains mode information of the electric appliances 110-1-110-5 based on the power consumption information (for example, the change of current wave or power) of these electric appliances produced when the electric appliances switch modes, so as to monitor the power consumption statuses of the electric appliances 110-1-110-5. In other words, when one of the electric appliances switches states, the power monitoring device 10 identifies the state of the electric appliance according to a variation in a power consumption feature of the main power supply TP. In addition, an electric appliance may have many different operation modes (also referred to as states of the electric appliance). For example, a fan has different speeds, and an air conditioner has dehumidification, fan, and sleep modes, etc. Electric appliances of different brands or models have slightly different power consumption performances. Thus, in the present embodiment, besides monitoring the on/off of an electric appliance, the type, state, or even brand and model of the electric appliance can be identified according to the variation in the power consumption feature of the main power supply TP. The structure and operation of the power monitoring device 10 can be referred to FIG. 2. FIG. 2 is a block diagram of the power monitoring device 10 according to the first embodiment of the invention.

Referring to FIG. 2, the power monitoring device 10 includes a measurement module 210 and a variation detection and search module and electric appliance signature database 220, wherein the electric appliance signature database may be a complete or partial database. The measurement module 210 measures a power consumption feature (for example, voltage, current, or power) of the main power supply TP, wherein the main power supply TP supplies electric power to the electric appliances 110-1-110-5 (as shown in FIG. 1) in the building 100. The variation detection and search module and electric appliance signature database 220 is coupled to the measurement module 210 for detecting and calculating a variation of the power consumption feature. In the present embodiment, the variation detection and search module and electric appliance signature database 220 detects whether the power consumption feature (for example, variable current wave, active power, reactive power, or harmonic wave information) of the main power supply TP changes. When the variation of the power consumption feature is greater than a threshold, the variation detection and search module and electric appliance signature database 220 searches the electric appliance signature database according to the variation of the power consumption feature to obtain electric appliances similar to the variation and the states of these electric appliances. Herein the electric appliance signature database can be established by its many users, and data stored in the power monitoring device 10 can be the entire electric appliance signature database or part of the electric appliance signature database. Meanwhile, data in the electric appliance signature database can be manually or automatically updated through a network or an external memory device.

Figure 3:
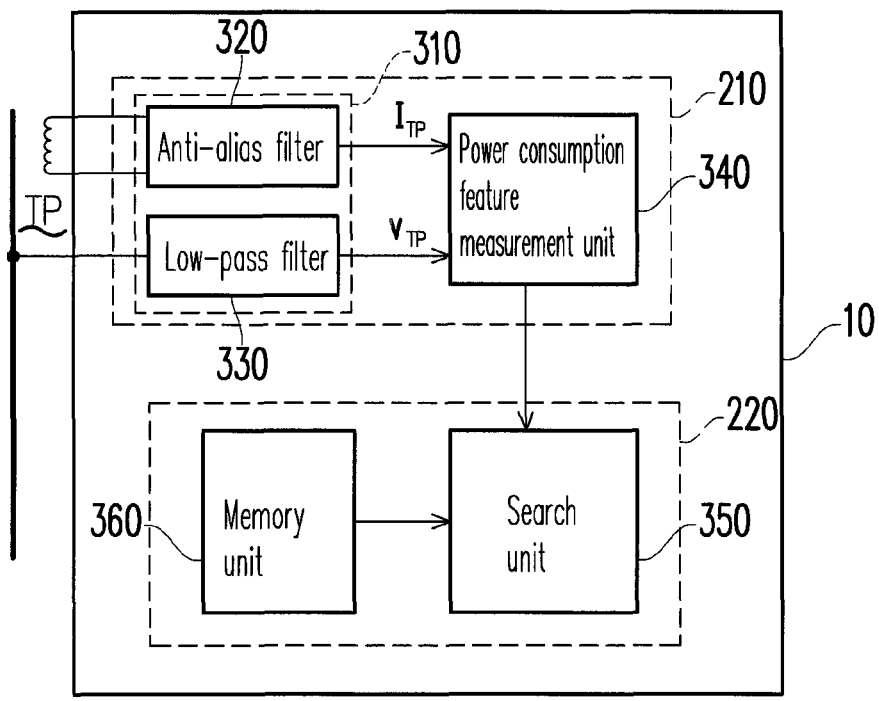
FIG. 3 is a detailed block diagram of the power monitoring device in FIG. 2.

The circuit structure of the power monitoring device 10 in FIG. 2 will be explained herein in detail. FIG. 3 is a detailed block diagram of the power monitoring device 10 in FIG. 2. Referring to FIG. 3, the measurement module 210 includes a filter unit 310 and a power consumption feature measurement unit 340. The filter unit 310 measures a power consumption feature of a power supply and filters out noises in the power consumption feature. In the present embodiment, the filter unit 310 includes an anti-alias filter 320 and a low-pass filter 330. The anti-alias filter 320 measures a current $I_{TP}$ of the main power supply TP, the low-pass filter 330 measures a voltage $V_{TP}$ of the main power supply TP, and the anti-alias filter 320 and the low-pass filter 330 transmit the current $I_{TP}$ and the voltage $V_{TP}$ to the power consumption feature measurement unit 340. In addition, in the present embodiment, the anti-alias filter 320 and the low-pass filter 330 may be implemented by using RC filter circuits. However, the invention is not limited thereto.

Referring to FIG. 3 again, the power consumption feature measurement unit 340 is coupled to the filter unit 310, and which samples the current $I_{TP}$ and the voltage $V_{TP}$ to obtain a characteristic parameter list of the main power supply TP. In the present embodiment, the main power supply TP is an AC power supply. Accordingly, the current $I_{TP}$ and the voltage $V_{TP}$ can be expressed as:

$$I_{TP}(t) = I_{max} \cos(\overline{\omega} t/\beta) \quad (1)$$

$$V_{TP}(t) = V_{max} \cos(\overline{\omega} t/\delta) \quad (2)$$

In foregoing expressions (1) and (2), $I_{max}$ and $V_{max}$ are respectively the maximum value of the current $I_{TP}$ and the maximum value of the voltage $V_{TP}$, $\omega$ is the frequency of the main power supply TP, and $\delta$ and $\beta$ are respectively the phase angle of the current $I_{TP}$ and the phase angle of the voltage $V_{TP}$. The power consumption feature measurement unit 340 can calculate the characteristic parameter list of the main power supply TP by using foregoing expressions (1) and (2). The characteristic parameter list is composed of different characteristic parameters (for example, a voltage root-mean-square value VX, a current root-mean-square value IX, an active power PAX, a reactive power PRX, harmonic wave information HX of the current wave, and a transient current wave TCWX produced when an electric appliance switches states) of the main power supply TP and is used for indicating the power information obtained every time when the main power supply TP is sampled. Following expressions (3)-(7) shows the characteristic parameters in the characteristic parameter list of the present embodiment and the calculations thereof, wherein the harmonic wave information HX is a characteristic parameter generated by performing a Fourier transform on the current wave.

$$VX = \frac{V_{max}}{\sqrt{2}} \quad (3)$$

$$IX = \frac{I_{max}}{\sqrt{2}} \quad (4)$$

$$PAX = VX \times IX \times \cos(\delta - \beta) \quad (5)$$

$$PRX = VX \times IX \times \sin(\delta - \beta) \quad (6)$$

$$HX = \sum_{k=1}^{\infty} I_{max} \cos(k\omega t + \beta) \quad (7)$$

Foregoing characteristic parameters are only examples in the present embodiment but not intended to limit the scope of the invention. A designer can add other characteristic parameters or skip some of the characteristic parameters according to the actual design requirement, so as to monitor the main power supply TP and search the electric appliance signature database according to these characteristic parameters. In addition, the power consumption feature measurement unit 340 in the present embodiment is implemented by using a power supply measurement chip ADE7756 provided by Analog Devices, Inc., (ADI), US. The ADE7756 chip can sample at a rate of 7.6 k times/second and transmit the characteristic parameter list to the variation detection and search module and electric appliance signature database 220 through a serial peripheral interface (SPI) bus. However, the ADE7756 chip will not be described in, and the implementation of the power consumption feature measurement unit 340 is not limited herein.

Referring to FIG. 3 again, the variation detection and search module and electric appliance signature database 220 includes a memory unit 360 and a search unit 350. The memory unit 360 stores the electric appliance signature database. The search unit 350 is coupled to the memory unit 360. The search unit 350 detects and calculates a variation characteristic parameter list of the variation according to a currently sampled characteristic parameter list and a previously sampled characteristic parameter list. The characteristic parameters in the variation characteristic parameter list include harmonic wave information of the variable current wave (the harmonic wave difference between a currently sampled current wave and a previously sampled current wave), a current root-mean-square value variation (the difference between a currently sampled current root-mean-square value and a previously sampled current root-mean-square value), an active power, a reactive power, and the transient current wave produced when the electric appliance switches states. In other embodiments, the characteristic parameters in the variation characteristic parameter list may also include other electric parameters of the main power supply TP, such as the difference between the phase angles of the current and the voltage. However, the invention is not limited thereto. Next, when the search unit 350 detects that the power consumption feature is greater than the threshold, the search unit 350 searches the electric appliance signature database in the memory unit 360 according to the variation characteristic parameter list, so as to obtain one or more candidate electric appliances similar to the variation and the states of these electric appliances or a combination of a plurality of candidate electric appliances. In the present embodiment, the search unit 350 is implemented by using a PIC18F26J11 single chip provided by Microchip Technology Inc. However, the invention is not limited thereto, and the search unit 350 may also be implemented by using a field-programmable gate array (FPGA), a complex programmable logic device (CPLD), or an application specific integrated circuit (ASIC).

If the power monitoring device 10 detects the state of the electric appliance for the first time, the power monitoring device 10 notifies the user and requests the user to confirm the search result. The user contributes data to the electric appliance signature database by confirming the search result, or selecting a correct electric appliance (or a set of correct electric appliances) among the candidate electric appliances, or providing the correct electric appliance(s) by his/her own self. The power consumption feature of the electric appliance confirmed by the user and the corresponding information are used for updating the electric appliance signature database in the memory unit 360. Data stored in the power monitoring device 10 may be the entire electric appliance signature database or part of it, and which can be manually or automatically updated through a network or an external memory device.

Herein the content and purpose of the electric appliance signature database established by its many users will be explained in detail. In the present embodiment, variations of power consumption features produced when the electric appliances 110-1-110-5 switch states are recorded at first, and the associations between the titles of the electric appliances (for example, electric appliance identification value is obtained to get the corresponding title of the electric appliance), the states of the electric appliances, and the variations of the power consumption features are recorded into the electric appliance signature database. To be specific, a different variation of the power consumption feature is produced when different electric appliance switches states. For example, different current variation, power, harmonic wave information produced by performing Fourier transform on the variable current wave, and transient current wave produced at electric appliance state switching are produced when a fan and an air conditioner are switched from the off state to the on state. During the construction of the electric appliance signature database, a user can change the state of an electric appliance, and when a variation of the power consumption feature is detected, the user stores the electric appliance, the state of the electric appliance, and the variation of the power consumption feature into the electric appliance signature database by selecting or inputting the electric appliance and the state of the electric appliance. Thus, in an embodiment of the invention, the electric appliance signature database can be established by using the variation of a power consumption feature of the main power supply TP and the titles, power consumption features, and states of corresponding electric appliances with the help of users. For the convenience of description, a simple electric appliance signature database (as shown in following table (1)) is listed herein in order to set forth the spirit of the present embodiment.

ated by performing Fourier transform on the variable current wave), and transient current wave. However, the invention is not limited thereto.

Table (1) will be explained herein as an example. Assuming the electric appliance 110-1 to be a fan 110-1, currently there are four related data provided by users in the electric appliance signature database. The electric appliance data with the database numbers 1-1 to 1-3 and the database number 2-1 are related to fans 110-1 of the same brand and model but provided by different users. For example, the electric appliance data with the database numbers 1-1 to 1-3 are provided by one user, while the electric appliance data with the database number 2-1 is provided by another user. The fan 110-1 has three different states: "first speed", "second speed", and "off". Thus, the first row of table (1) shows electric appliance information when the electric appliance is a fan (with the electric appliance identification value 110-1) and the fan 110-1 switches from the off state to first speed. However, as shown in table (1), the variation characteristic parameter list when the fan 110-1 changes from the off state to the first speed is composed of average values of (I11, PA11, PR11, H11, T11) and (I14, PA14, PR14, H14, T14). Namely, the variation characteristic parameter list may be composed of average values of characteristic parameters of electric appliances of the same model but provided by different users and can be used for data comparison and search as the power consumption feature of this electric appliance model. Accordingly, as shown in table (1), the variation characteristic parameter list when the fan 110-1 switches from the off state to the second speed is (I12, PA12, PR12, H12, T12). Thereby, more electric appliance signature data is obtained and accordingly more clearly the power consumption performance of an electric appliance is reflected when more users are involved. On the other hand, power consumption features of new electric appliances can be recorded into this database through user feedbacks.

TABLE 1

| Database Number | Electric Appliance Identification Value | Type of Electric Appliance | Brand And Model of Electric Appliance | State Of Electric Appliance | Current Variation | Active Power | Reactive Power | Harmonic Wave Information | Transient Current Wave |
|---|---|---|---|---|---|---|---|---|---|
| 1-1 | 110-1 | Fan | Brand A Model B | Off-> First speed | I11 | PA11 | PR11 | H11 | T11 |
| 1-2 | 110-1 | Fan | Brand A Model B | Off-> Second speed | I12 | PA12 | PR12 | H12 | T12 |
| 1-3 | 110-1 | Fan | Brand A Model B | First speed-> off | I13 | PA13 | PR13 | H13 | T13 |
| 2-1 | 110-1 | Fan | Brand A Model B | Off-> First speed | I14 | PA14 | PR14 | H14 | T14 |
| 3-1 | 110-2 | Fan | Brand C Model D | Off-> First speed | I15 | PA15 | PR15 | H15 | T15 |
| 4-1 | 110-3 | Fan | Brand E Model F | Off-> First speed | I16 | PA16 | PR16 | H16 | T16 |
| 5-1 | 110-5 | Refrigerator | Brand A Model G | Compressor starts | I17 | PA17 | PR17 | H17 | T17 |
| ... | ... | ... | ... | ... | ... | ... | ... | ... | ... |

In foregoing table (1), the electric appliance signature database has following fields: database number, electric appliance identification value, type of electric appliance, brand and model of electric appliance, state of electric appliance, and various characteristic parameters in the variation characteristic parameter list. The variation characteristic parameter list in table (1) include such characteristic parameters as current variation, active power, harmonic wave information (gener- If the power monitoring device 10 detects the state of the electric appliance for the first time (assuming the variation characteristic parameter list thereof is (I18, PA18, PR18, H18, T18)), the power monitoring device 10 notifies the user and requests the user to confirm the search result. The user contributes data to the electric appliance signature database by confirming the search result, or selecting a correct electric appliance (or a set of correct electric appliances) among the candidate electric appliances, or providing the correct electric appliance(s) by his/her own self. For example, the power monitoring device 10 determines that the variation characteristic parameter list is most similar to the variation characteristic parameter list when the fan 110-1 switches from the off state to the first speed, so that through the confirmation of the user, the power consumption feature of the electric appliance confirmed by the user and the corresponding information are used for updating the electric appliance signature database in the memory unit 360 and are stored in the column with the database number 6-1. Accordingly, the power consumption feature of the fan 110-1 when the fan 110-1 switches from the off state to the first speed is constantly changed due to data contributed by users.

Figure 4:
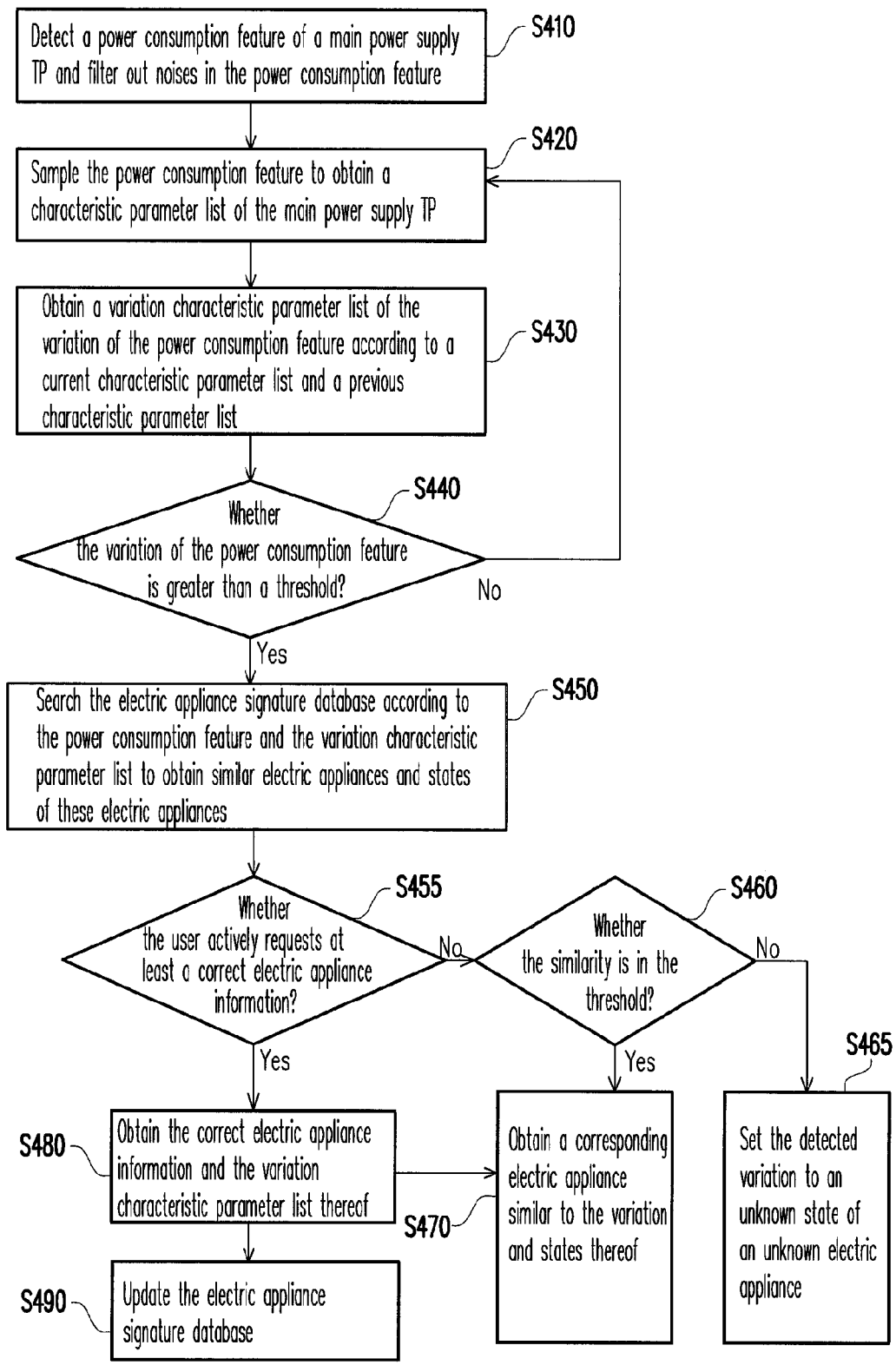
FIG. 4 is a flowchart of a power monitoring method for identifying the state of an electric appliance according to the first embodiment of the invention.

A power monitoring method for identifying the state of an electric appliance will be described herein with reference to the structure illustrated in FIG. 3 and the fan 110-1. FIG. 4 is a flowchart of a power monitoring method for identifying the state of an electric appliance according to the first embodiment of the invention. Referring to FIG. 4, in step S410, the anti-alias filter 320 and the low-pass filter 330 in the filter unit 310 detect a power consumption feature (for example, a current and a voltage) of the main power supply TP and filter out noises in the power consumption feature, so as to generate a current $I_{TP}$ and a voltage $V_{TP}$ of the main power supply TP. Then, in step S420, the power consumption feature measurement unit 340 samples the current $I_{TP}$ and the voltage $V_{TP}$ to obtain a characteristic parameter list of the main power supply TP.

Referring to FIG. 4 again, in step S430, the search unit 350 obtains a variation characteristic parameter list of the variation of the power consumption feature according to a current characteristic parameter list and a previous characteristic parameter list. In step S440, if the search unit 350 detects that the variation of the power consumption feature is greater than a threshold (for example, the current variation is greater than a current threshold), step S450 is executed. Otherwise, step S420 is executed again and the main power supply TP is constantly sampled to obtain the variation characteristic parameter list.

Figure 5A:
FIG. 5A illustrates a previously sampled current wave of a main power supply.
Figure 5B:
FIG. 5B illustrates a currently sampled current wave of a main power supply.

Steps S430-S440 will be described herein by taking the fan 110-1 as an example, and it is assumed that none of other electric appliances 110-2-110-5 switches states. FIG. 5A illustrates a previously sampled current wave of a main power supply, wherein the fan 100-1 is in the "off" mode. FIG. 5B illustrates a currently sampled current wave of a main power supply, wherein the fan 100-1 is in the "first speed" mode. In step S440, if the variation obtained by subtracting the power consumption characteristic parameters (for example, the current variation, the active power, or the reactive power) produced by the previously sampled current wave (as shown in FIG. 5A) and the currently sampled current wave (as shown in FIG. 5B) is greater than a threshold, it is determined that the fan 110-1 switches from the off state to the first speed. If two or more electric appliances are turned on, off or switched states at the same time, the power consumption feature produced is a combination of the variation characteristic parameter lists of multiple electric appliances in table (1). Thus, the power monitoring method in the invention is also applicable when two or more electric appliances switch states at the same time.

Contrarily, if the power consumption feature of the main power supply TP does not change or is very small, it is determined that none of the electric appliances 110-1-110-5 to which the main power supply TP supplies electric power switches states.

Thereafter, in step S450, the search unit 350 searches the electric appliance signature database according to the power consumption feature and the variation characteristic parameter list to obtain candidate electric appliances similar to one or more power consumption features in the electric appliance signature database and the states of these electric appliances or a combination of a plurality of power consumption features and the states thereof. To be specific, in step S450, the search unit 350 performs a Fourier transform on the variable current wave in the variation characteristic parameter list to obtain a comparison of harmonic wave information HX.

Additionally, the search unit 350 searches the electric appliance signature database according to the current variation IX, the active power PAX, the reactive power PRX, the harmonic wave information HX, the transient current wave TCWX produced when an electric appliance switches states in the variation characteristic parameter list (as shown in table (1)) to obtain similar electric appliance identification values and electric appliance states. In the present embodiment, the electric appliance signature database is searched by using the K-nearest neighbor (KNN) algorithm (not limited herein), and when the electric appliance signature database is searched according to the current variation IX, the active power PAX, the reactive power PRX, the harmonic wave information HX, and the transient current wave TCWX, because the KNN algorithm may produce error when the characteristic parameters are compared, multiple electric appliance identification values and the electric appliance states thereof may be obtained. If the variation characteristic parameter list (IX, PAX, PRX, HX, TCWX) obtained by the search unit 350 is most similar to the average value of the variation characteristic parameter lists of electric appliances of the same model and the same state in table (1) (for example, the detected variation characteristic parameter list is most similar to the average value of (I11, PA11, PR11, H11, T11) and (I14, PA14, PR14, H14, T14)), it is determined that the fan 110-1 switches from the off state to the first speed.

Referring to FIG. 4 again, in step S450, the variation detection and search module and electric appliance signature database searches for different power consumption features in the electric appliance signature database in foregoing table (1) according to the detected power consumption feature and characteristic parameter list thereof (the detected power consumption feature and characteristic parameter list thereof are referred as a detected variation hereinafter) to generate a matching result (or referred as a similarity) and a electric appliance search result. The electric appliance search result may include information of one or more candidate electric appliances, and the candidate electric appliance information may include titles and states information of these candidate electric appliances. In step S455, if the user actively requests to provide a correct electric appliance information (for instance, the user actively requests to input the correct electric appliance information, which may be one electric appliance information, a combination information for multiple electric appliances and states of these electric appliances), or the user actively requests to confirm the electric appliance search result for selecting the correct electric appliance information among information of the candidate electric appliances in the electric appliance search result, it is determined that a new type of electric appliance or a newly installed electric appliance is detected.

Thus, the process proceeds to step S480 from step S455, the variation detection and search module obtains the correct electric appliance information according to the information inputted by the user, and refers the detection variation as a power consumption feature of the correct electric appliance (for instance, the detection variation is referred as a variation characteristic parameter list of the correct electric appliance).

Then, step S480 is executed, and the electric appliance signature database is updated corresponding to the aforementioned correct electric appliance and the detected variation. The electric appliance corresponding to aforementioned power consumption feature, the title and the state thereof are obtained. When the process proceeds to step S490 from step S480, step S470 is executed, and the title and the state of corresponding electric appliance are obtained according to the correct electric appliance information. The electric appliance signature database can be constructed by its many users or provided by any electric appliance signature database provider.

When the user doesn't actively requests to provide the correct electric appliance information, the process proceeds to step S460 from step S455. The similarity of searching in the electric appliance signature database and a threshold are compared. When the similarity between one or more data in the electric appliance signature database and the detected power consumption feature variations is smaller than the threshold, the process proceeds to step S470 from step S460, so as to obtain a electric appliance, the title and the state thereof, wherein the data corresponding to the electric appliance in the electric appliance signature database and the detected variation are much similar (i.e., the similarity is the smallest).

In detail with step S470, if a data of a power consumption feature of one electric appliance or a combination of multiple electric appliances in the electric appliance signature database and the state thereof are similar to the detected power consumption feature, and the similarity thereof (i.e., aforementioned matching result) is in the threshold, electric appliances similar to the power consumption feature and the states thereof are obtained according to the data. If there are multiple data of multiple power consumption features in the electric appliance signature database similar to the detected power consumption feature and all the similarities are all in the threshold, the electric appliance corresponding to aforementioned the most similar power consumption feature the state thereof is obtained. Contrarily, if no power consumption feature in the electric appliance signature database is similar to the detected variation (i.e., the similarities are not in the threshold), it is determined that the process proceeds to step S465 from step S460, and the detected variation is set to an unknown state of an unknown electric appliance or a combination of multiple electric appliances.

Thereby, the power monitoring device 10 can identify the state switching timing of each electric appliance according to variations of a power consumption feature of the main power supply TP, so as to record the power consumption of the electric appliance. For example, the power monitoring device 10 may record the state switching timing and the power consumption in each state of the fan 110-1 and other electric appliances 110-2-110-5, so as to obtain the detailed power consumption information of each of the electric appliances 110-1-110-5 in the building 100. Besides, the power consumption situation, power consumption efficiency, power saving suggestions, and power management of each electric appliance recorded in the power monitoring device 10 can be displayed in a computer, a smart phone, other any other information display device through a network transmission path (for example, a wired network or a wireless network), which will not be described herein. The power monitoring device 10 can be controlled by using aforementioned information display devices so that the electric appliance signature database can be improved, and a user can be automatically notified to adopt a power saving plane.

Figure 6:
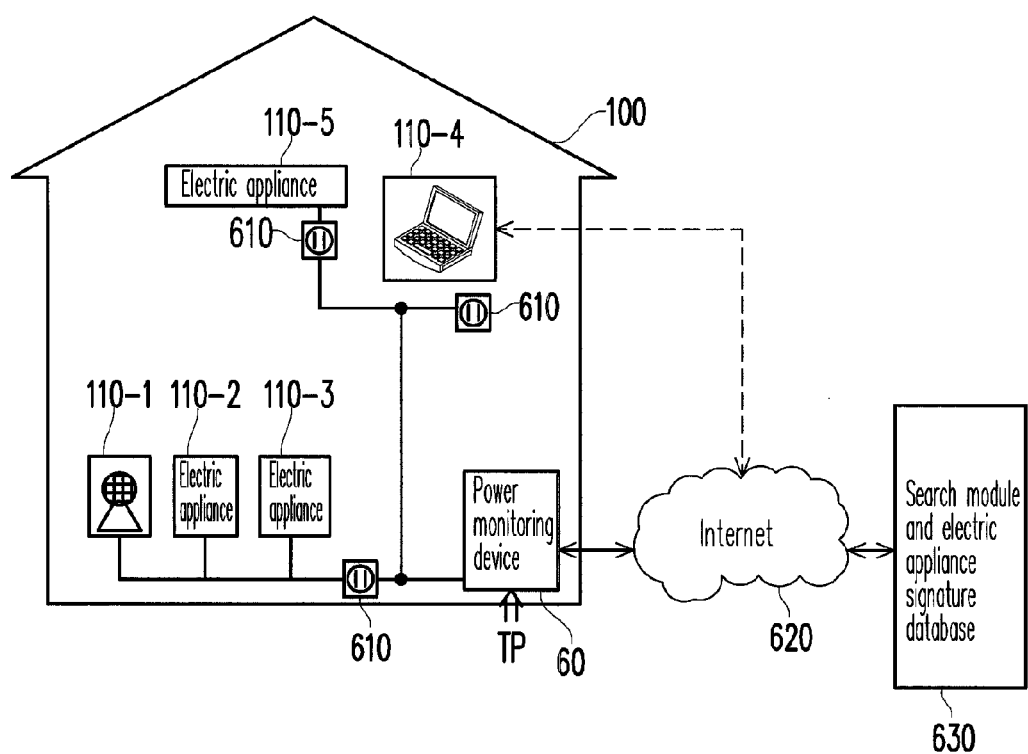
FIG. 6 is a diagram of a power monitoring device for identifying the state of an electric appliance according to a second embodiment of the invention.

A second embodiment of the invention will be described herein with reference to FIG. 6. FIG. 6 is a diagram of a power monitoring device 60 for identifying the state of an electric appliance according to the second embodiment of the invention. The present embodiment is similar to the first embodiment. Accordingly, the same operation details will not be described herein. The difference between the two embodiments is that the memory unit 360 in the power monitoring device 10 illustrated in FIG. 3 has a limited storage capacity and the electric appliance signature database stored therein cannot be updated in real time. Contrarily, the power monitoring device 60 in the present embodiment can provide a large electric appliance signature database and a highly efficient search capability through the Internet 620 and the cloud computing technology, and manufacturers and users are allowed to expand or update the electric appliance signature database at any time or backup power consumption records into a search module and electric appliance signature database 630 on the Internet 620 through a cloud storage technique. In other embodiments, when the power monitoring device 10 cannot find an electric appliance state in the electric appliance signature database, it may search the electric appliance signature database again by using the Internet 620 and the search module and electric appliance signature database 630, so as to increase the success rate in electric appliance state identification.

Referring to FIG. 6, the power monitoring device 60 is connected to the Internet 620 and accordingly to the search module and electric appliance signature database 630. In the present embodiment, it is assumed that the electric appliance 110-4 is an information display device 110-4 (such as a notebook computer). The electric appliance 110-4 accesses the power consumption information of the electric appliances 110-1-110-5 recorded in the power monitoring device 60 by using the Internet 620 as an information transmission path and provides the information to the user. Besides, by executing the functions such as power consumption efficiency detection, power saving suggestions (for example, an electric appliance needs to be cleaned to reduce its power consumption, or whether an electric appliance is old or damaged), and power management with the power consumption features of the electric appliances, power consumption causes, and power saving suggestions provided by users in the search module and electric appliance signature database 630, a user can perform system control over the power monitoring device 60, improve the electric appliance signature database, and automatically receive a power saving plan through the information display device 110-4, which will not be described herein.

Figure 7:
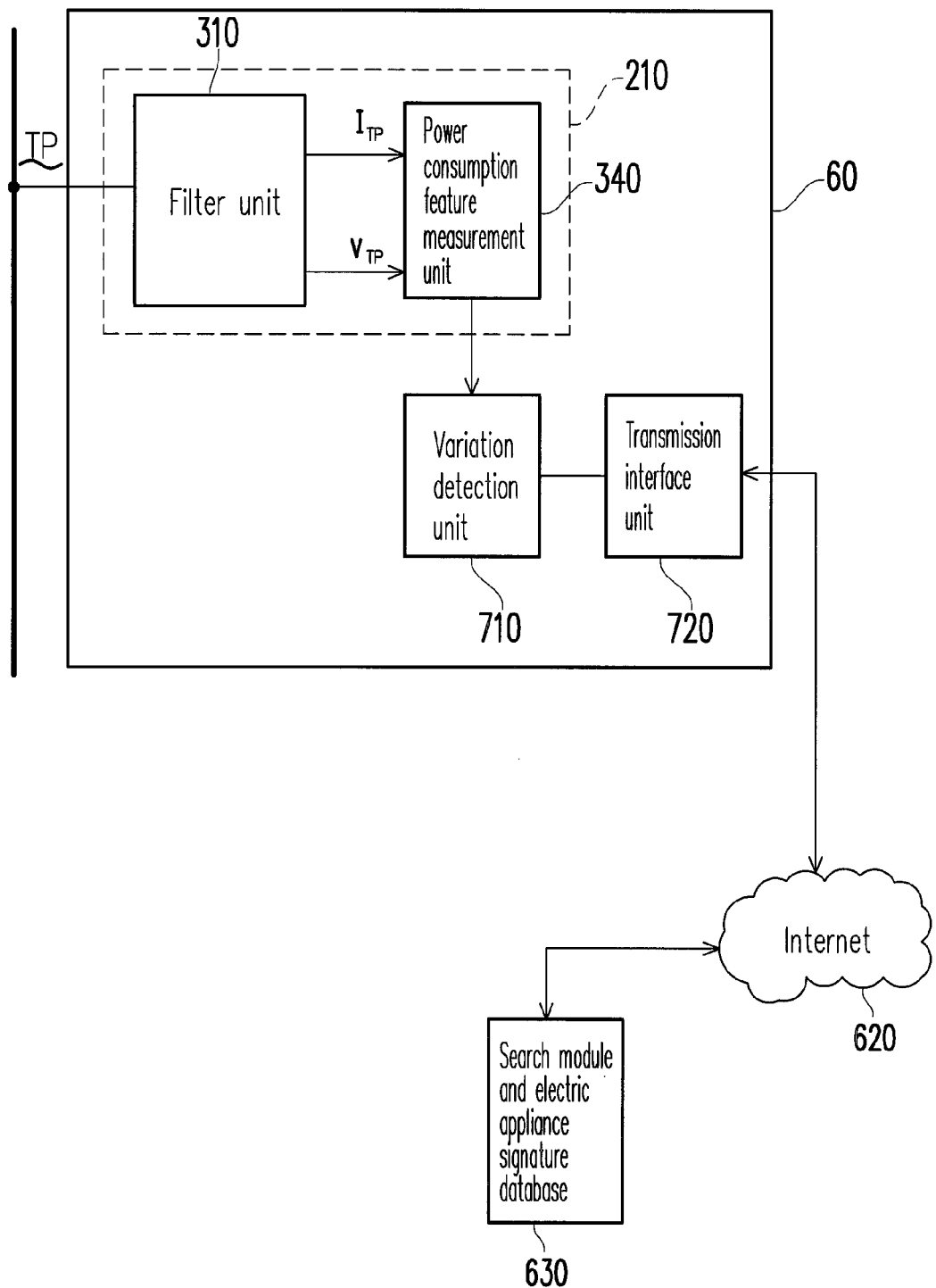
FIG. 7 is a block diagram of a power monitoring device for identifying the state of an electric appliance according to the second embodiment of the invention.

FIG. 7 is a block diagram of the power monitoring device 60 according to the second embodiment of the invention. The power monitoring device 60 includes a measurement module 210, a variation detection unit 710, a transmission interface unit 720, and a search module 630 connected via the Internet 620. In the present embodiment, the variation detection unit 710, the transmission interface unit 720, and the search module 630 are referred in general as a variation detection and search module and electric appliance signature database 220. The variation detection unit 710 detects and calculates a variation characteristic parameter list of a variation of a power consumption feature according to a current characteristic parameter list and a previous characteristic parameter list. In the present embodiment, the power monitoring device 60 realizes its operation of searching the electric appliance signature database through the cloud computing technology in order to reduce the operation load thereof. Thus, when the power consumption feature is greater than a threshold, the variation detection unit 710 generates a variation signature packet, wherein the variation signature packet contains the variation characteristic parameter list and related information. The transmission interface unit 720 transmits the variation signature packet to the search module and electric appliance signature database 630 via the Internet 620.

Referring to FIG. 7 again, in the present embodiment, the search module and electric appliance signature database 630 may be composed of one or more servers to achieve an enhanced search capability. Or, in the present embodiment, the capacity of the electric appliance signature database may be increased by using redundant array of independent disks (RAID). However, the invention is not limited thereto. The search module and electric appliance signature database 630 receives the variation signature packet via the Internet 620 and searches the electric appliance signature database according to the variation characteristic parameter list in the variation signature packet, so as to obtain electric appliances similar to the variation and the states of these electric appliances. The method for searching the electric appliance signature database has been described in the first embodiment therefore will not be described herein. In the present embodiment, the search result (i.e., the electric appliances and the states thereof) generated by the search module 630 is transmitted back to the transmission interface unit 720 via the Internet 620, so that the variation detection unit 710 can identify and monitor the states and power consumption situations of the electric appliances 110-1-110-5 according to foregoing search results. Meanwhile, a user can contribute data to the electric appliance signature database by confirming the search result, or selecting a correct electric appliance and the state (or a set of correct electric appliances and the states) thereof or providing the correct electric appliance(s) by his/her own self or update the electric appliance signature database through the Internet 620.

In other embodiments of the invention, the building 100 may further have a plurality of load sensing units 610. The load sensing units 610 are installed into the electrical outlets to which the electric appliances 110-1-110-5 are connected. The load sensing units 610 detect whether there is any load on the electric appliances connected to the electrical outlets and send the detected load information to the power monitoring device 60. Besides, the load sensing units 610 are connected to the power monitoring device 60 via a power line communication (PLC) network (for example, X10) or a wireless network (for example, a Zigbee or radio frequency (RF) network). Thus, according to the information of the electric appliances and the load information received from the load sensing units 610, the power monitoring device 60 associates the electric appliances and the electrical outlets. If the position information of the electrical outlets and the load sensing units 610 is provided, the power monitoring device 60 can determine the position of each of the electric appliances 110-1-110-5 and the power consumption state thereof (for example, the electric appliances 110-1-110-3 on the first floor and the electric appliances 110-4-110-5 on the second floor) and accordingly analyzes the power consumption distribution at different areas in the building 100, so as to help a company or a household to find out the power consumption cause. Moreover, if the electric appliances 110-1-110-5 can be remotely controlled (for example, remotely turned on/off) via a PLC network or a wireless network, a user can make the power monitoring device 60 to control the electric appliances 110-1-110-5 based on a pre-established power saving plan or remotely turn off those unused electric appliances through the power monitoring device 60, so as to reduce the power consumption.

Additionally, through related information on the Internet 620, the search module and electric appliance signature database 630 can further obtain electric appliances of the same type and with similar specifications but lower power consumptions and the power saving information thereof from the electric appliance signature database and provide reasonable suggestions on electric appliance replacement along with prices of the electric appliances obtained from the Internet 620, so as to allow a user to understand the cost for replacing an electric appliance.

In a household, the total current is usually under 100 amp and about 30 to 50 electric appliances are usually used. Thus, in the embodiment described above, a single power monitoring device 10 installed at the main power supply TP is enough to satisfy the user's demand. However, multiple power monitoring devices should be installed for monitoring the electric appliances in a distributive or tiered manner in a site with a large number of electric appliances (for example, a factory or a building).

Figure 8:
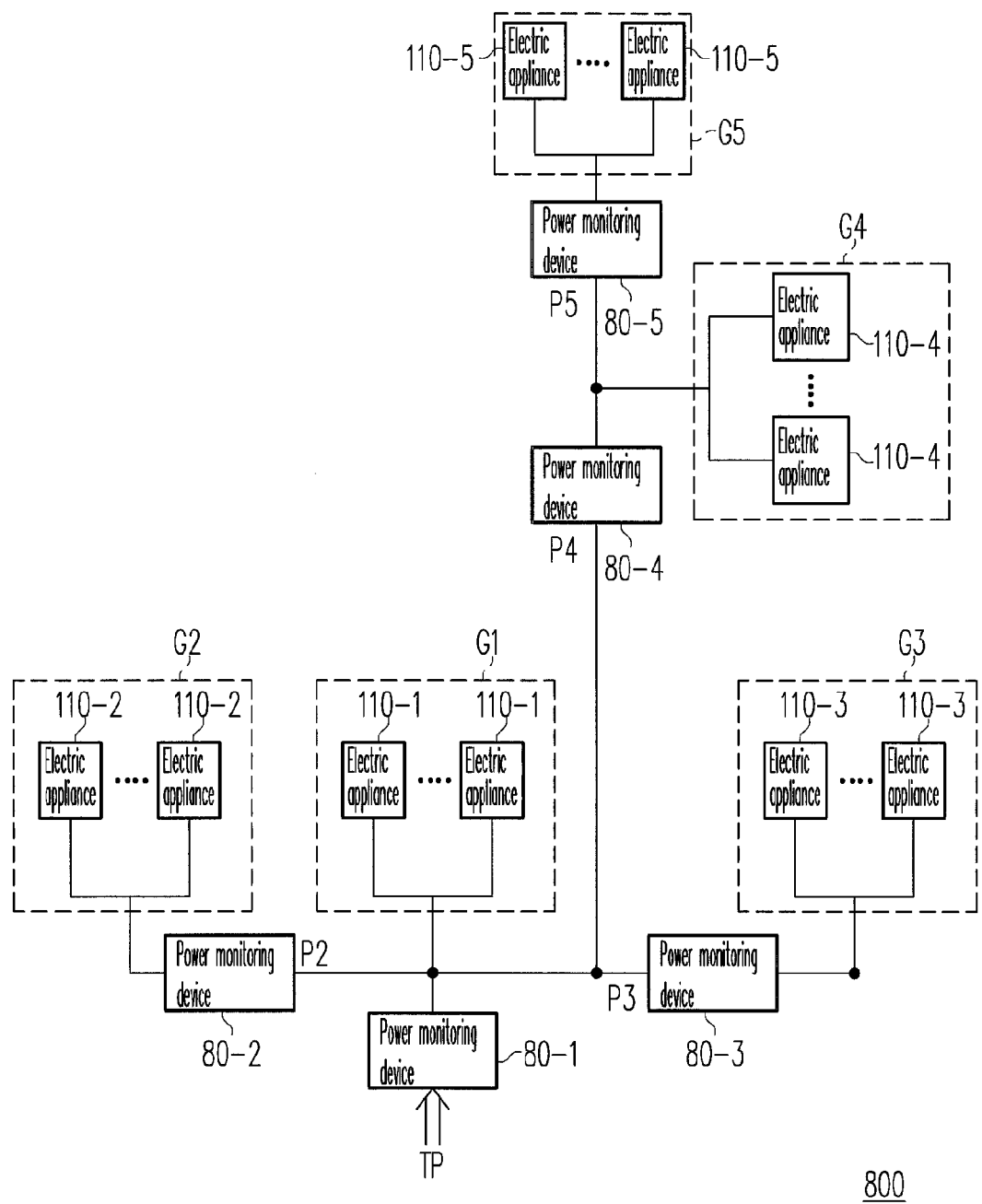
FIG. 8 is a diagram of a power monitoring system for identifying the state of an electric appliance according to a third embodiment of the invention.

FIG. 8 is a diagram of a power monitoring system 800 for identifying the state of an electric appliance according to a third embodiment of the invention. Referring to FIG. 8, the power monitoring system 800 includes a plurality of power monitoring devices 80-1-80-5 and a plurality of electric appliance groups G1-G5. In the present embodiment, the number of the electric appliances 110 in each of the electric appliance groups G1-G5 and the total power consumption thereof are both under specific limitations. The upper limit of the electric appliance number is determined according to the maximum number of electric appliances to be monitored by the power monitoring devices 80-1-80-5. However, the invention is not limited thereto. It should be noted herein that FIG. 8 illustrates only an exemplary embodiment, and one applying the present embodiment should be able to adjust the numbers and relative positions of the power monitoring devices 80-1-80-5 and the electric appliance groups G1-G5 according to the actual design requirement.

According to the present embodiment, because the variations of a power consumption feature of branch power supplies (for example, a second power supply P2, a third power supply P3, and a fourth power supply P4) affect the main power supply (for example, the main power supply TP), each of the power monitoring devices 80-1-80-5 in the power monitoring system 800 exchanges information about power consumption feature variation with neighboring power monitoring devices 80-1-80-5 so that the affection of the branch power supplies to the power monitoring devices on an upper level can be eliminated and the states of the electric appliances in the corresponding electric appliance group can be monitored.

In other words, the power monitoring devices 80-1-80-5 provided by the invention can respectively monitor the states, power consumption modes, and power consumption performances of the electric appliances 110-1-110-5 in the electric appliance groups G1-G5 without interfering each other. In addition, the power monitoring system 800 can distribution the operation load of monitoring the electric appliances to the power monitoring devices 80-1-80-5 and reduce the number of smart meters required for establishing a smart grid.

Figure 10A:
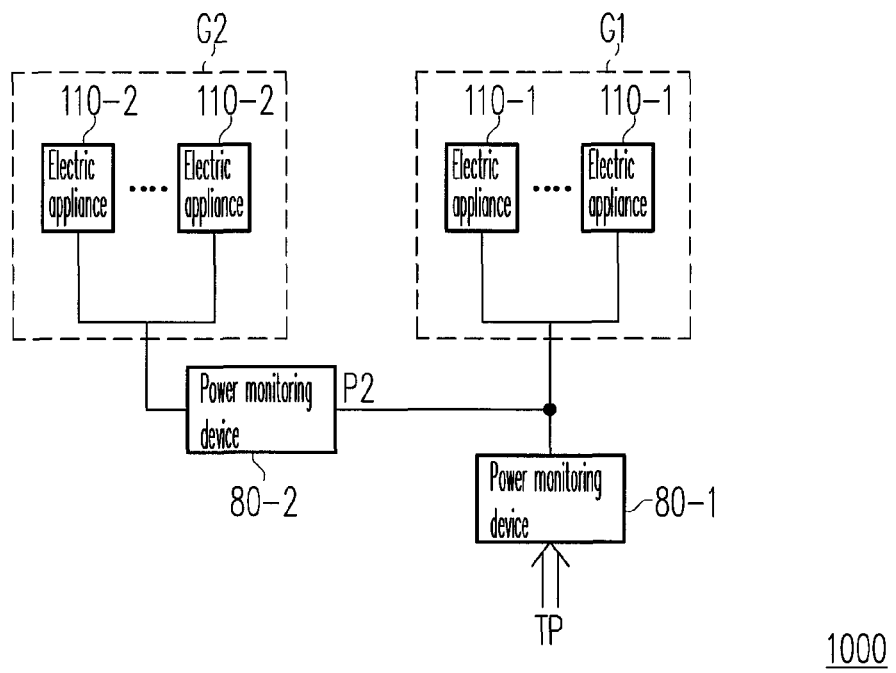
FIG. 10A is a partial view of the power monitoring system in FIG. 8.
Figure 11:
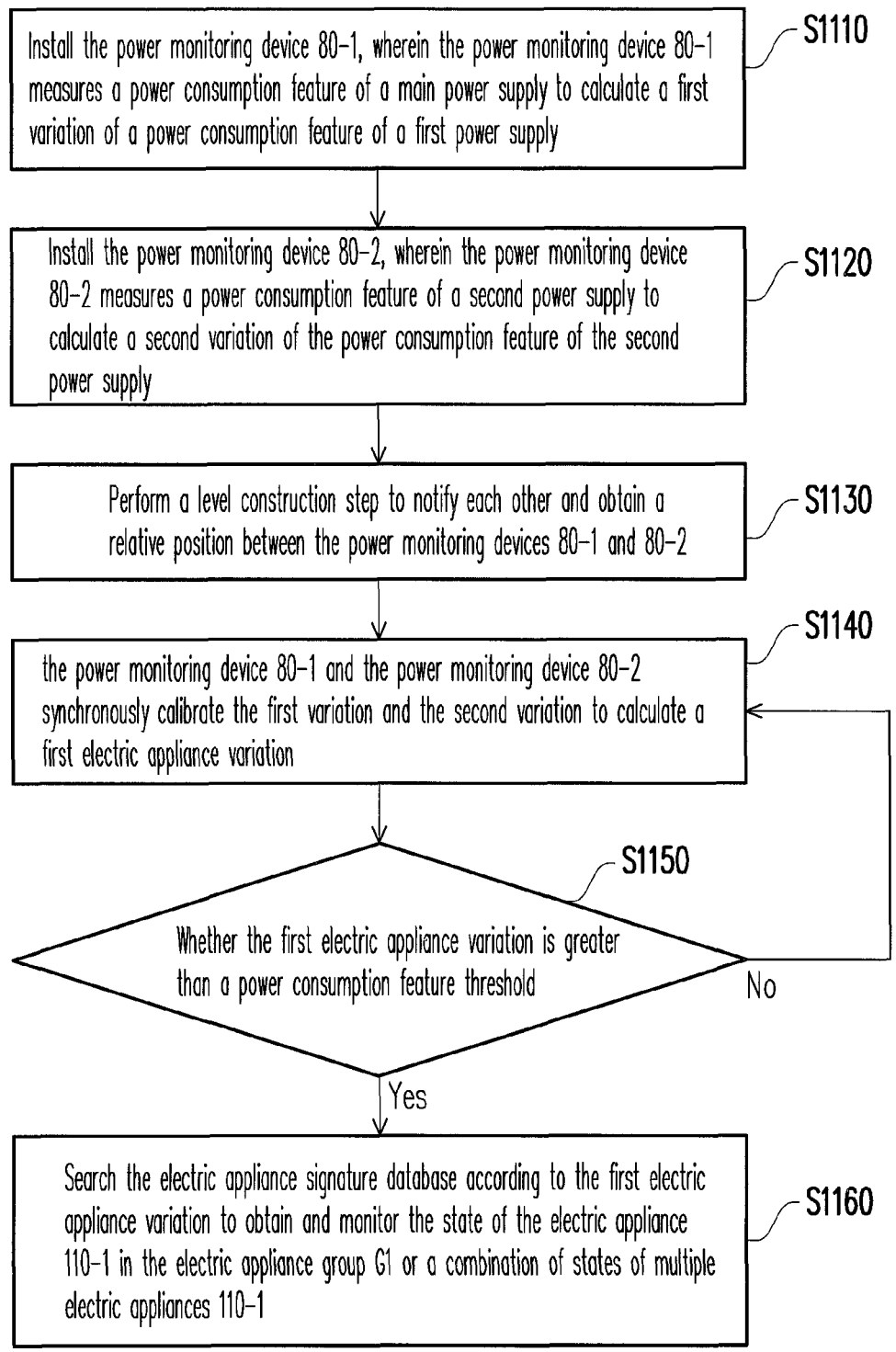
FIG. 11 is a flowchart of a power monitoring method for identifying the state of an electric appliance according to a fourth embodiment of the invention.

For the convenience of description, part of the power monitoring system 800 is illustrated in FIG. 10A as a power monitoring system 1000 in a fourth embodiment (FIG. 10A is a diagram illustrating a part of the power monitoring system 1000 in FIG. 8), and the present embodiment will be described herein with reference to the power monitoring devices 80-1-80-2 and the electric appliance groups G1-G2 illustrated in FIG. 10A and the power monitoring method illustrated in FIG. 11. FIG. 11 is a flowchart of a power monitoring method for identifying the states of electric appliances according to a fourth embodiment of the invention.

Herein it is assumed that none of the power monitoring devices 80-1-80-2 is installed in the power monitoring system 1000. First, in step S1110, the power monitoring device 80-1 is installed at the main power supply TP. As described in the first and the second embodiment, the power monitoring device 80-1 samples a power consumption feature of the main power supply TP to calculate a variation of the power consumption feature of the main power supply TP between two sampling operations and accordingly generate a variation characteristic parameter list corresponding to the variation. The main power supply TP in FIG. 10A supplies electric power to the electric appliance groups G1-G2. In the present embodiment, the variation of the power consumption feature of the main power supply TP and the variation characteristic parameter list thereof are referred to as a first variation.

Then, in step S1120, the power monitoring device 80-2 is installed at the second power supply P2. The second power supply P2 is a branch power supply of the main power supply TP and which supplies electric power to the electric appliance group G2. Similar to that in step S1110, in step S1120, the power monitoring device 80-2 also calculates a variation of a power consumption feature of the second power supply P2 between two sampling operation, and the variation is referred to as a second variation.

Figure 10B:
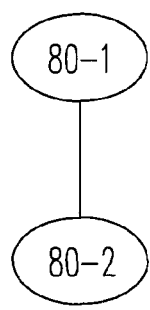
FIG. 10B is a diagram of an electricity meter topology network in FIG. 10A.

Since the second power supply P2 is a branch power supply of the main power supply TP, the second variation detected by the power monitoring device 80-2 also exists in the first variation detected by the power monitoring device 80-1. As a result, the power monitoring device 80-1 cannot obtain the variation of the power consumption feature corresponding to the electric appliance group G1. Accordingly, in step S1130, the installed power monitoring devices (i.e., the power monitoring devices 80-1-80-2 in the present embodiment) perform a level construction step to notify each other about the relative position between them. In other words, a power monitoring device on an upper level (for example, the power monitoring device 80-1) gets to know that there is a power monitoring device (for example, the power monitoring device 80-2) on a lower level through the level construction step. Accordingly, an electricity meter topology network of the power monitoring devices is established, or each of the power monitoring devices may even be located (i.e., where in the building each of the power monitoring devices is located is determined). The electricity meter topology network of the power monitoring system 1000 in FIG. 10A is as shown in FIG. 10B. FIG. 10B is a diagram of the electricity meter topology network in FIG. 10A.

Next, in step S1140, the upper-level power monitoring device (for example, the power monitoring device 80-1) and the lower-level power monitoring device (for example, the power monitoring device 80-2) synchronously calibrate the first variation and the second variation, and after the power monitoring device 80-1 receives the second variation, it subtracts the second variation from the calibrated first variation to calculate a net variation of the electric appliance 110-1 in the electric appliance group G1 or a combination of power consumption feature variations of multiple electric appliances 110-1. Herein aforementioned net variation is referred to as a first electric appliance variation.

When the first electric appliance variation is greater than a power consumption feature threshold, the procedure proceeds to step S1160 from step S1150, wherein the power monitoring device 80-1 searches the electric appliance signature database according to the first electric appliance variation to obtain and monitor the state of the electric appliance 110-1 in the electric appliance group G1 or a combination of states of multiple electric appliances 110-1. On the other hand, when the first electric appliance variation is smaller than the power consumption feature threshold, the procedure returns step S1140 from step S1150 to keep calculating the first electric appliance variation and monitoring the electric appliance 110-1 in the electric appliance group G1.

The operation procedure described above is similar to that illustrated in FIG. 4 (especially the steps S1150 and S1160 in FIG. 11 and the steps S440 and S450 in FIG. 4). The difference is that in the present embodiment, the power monitoring device 80-1 obtains the second variation detected by the power monitoring device 80-2 on the lower level through the level construction step and synchronous calibration and subtracts the second variation from the first variation to eliminate the affection of the branch power supply (for example, the second power supply P2) to the main power supply (for example, the main power supply TP). This operation has been described in detail in foregoing embodiment therefore will not be described herein.

The level construction process in step S1130 will be explained in detail herein. In the present embodiment, the level construction step can be implemented through two ways. The first way is to make the power monitoring devices 80-1-80-2 to communicate with each via a wired network, a wireless network, or a PLC network, so as to obtain the relative position, locate the power monitoring devices 80-1-80-2, construct an electricity meter topology network, or even synchronously calibrate the power monitoring devices 80-1-80-2 via the PLC. However, if the present embodiment is implemented through this way, a communication chip has to be disposed in each power monitoring device. As a result, the implementation cost is increased.

In another way to implement the level construction step, because the power monitoring device 80-1 constantly detect the first variation of the main power supply TP, when the power monitoring device 80-2 is installed at the second power supply P2, the power monitoring device 80-1 on the upper level detects a meter consumption load of the power monitoring device 80-2 on the main power supply TP (because the second power supply P2 is a branch power supply of the main power supply TP), so that the existence of the power monitoring device 80-2 on the lower level can be detected through the electric appliance signature database and an electricity meter topology network of the power monitoring devices can be established. The second implementation technique does not require any communication chip to be installed in each power monitoring device therefore offers a lower implementation cost.

Figure 12:
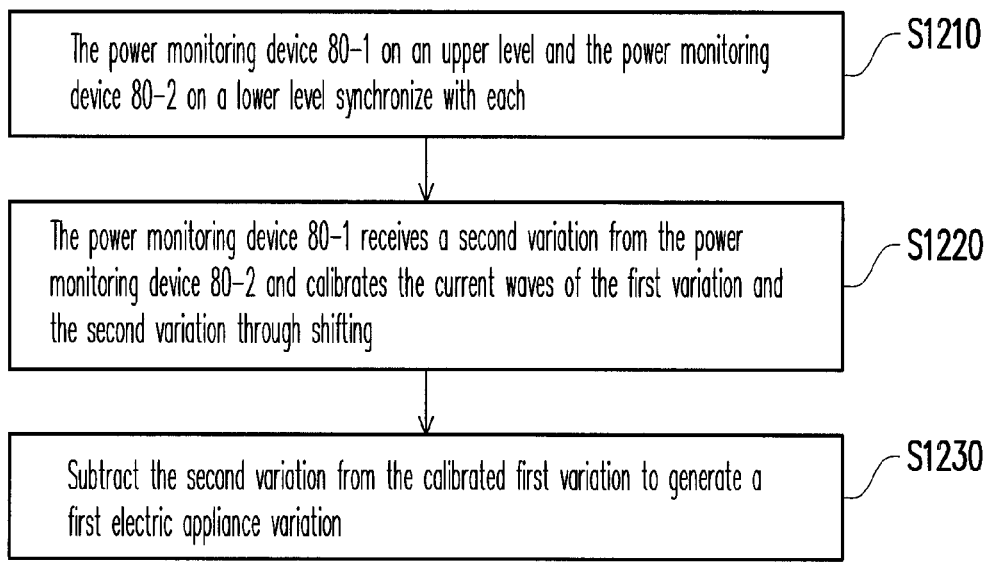
FIG. 12 is a detailed flowchart of step S1140 in FIG. 11.

Herein the procedure for calibrating the first variation and the second variation to obtain the first electric appliance variation in step S1140 will be described in detail with reference to FIGS. 10A, 10B, and 12. FIG. 12 is a detailed flowchart of step S1140 in FIG. 11. First, after the power monitoring device 80-1 detects the existence of a lower-level power monitoring device (for example, the power monitoring device 80-2), in step S1210, the upper- and lower-level power monitoring devices are synchronized, so as to allow the power monitoring devices 80-1-80-2 to detect the first variation and the second variation synchronously.

Figure 13:
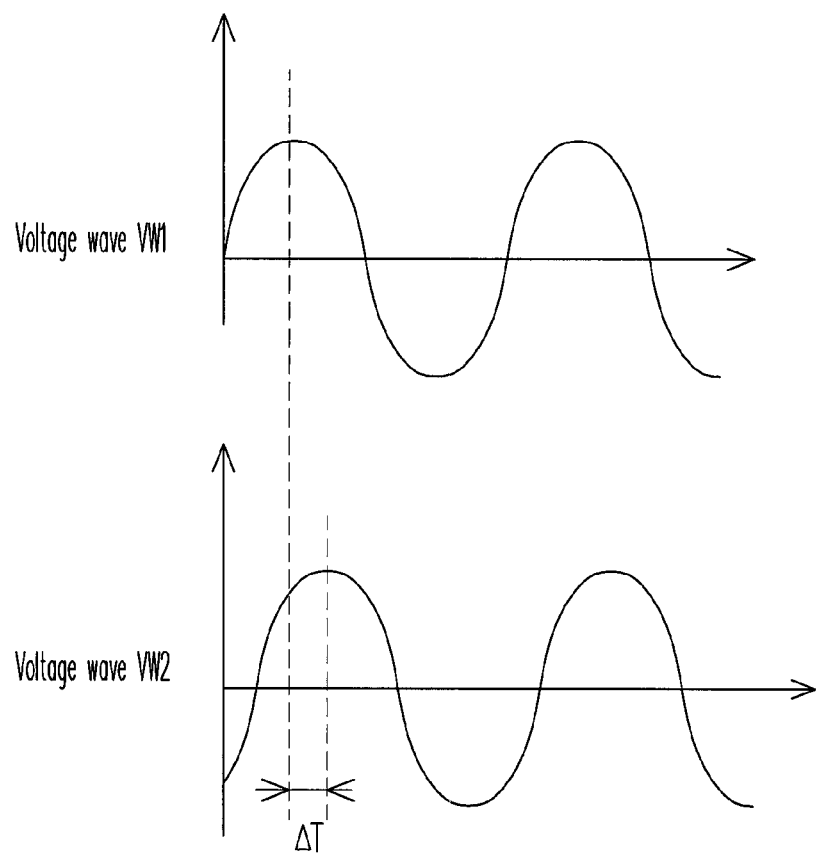
FIG. 13 is a diagram illustrating the time synchronization in step S1210.

To be specific, because the main power supply and the branch power supplies have the same voltage sine waves, in step S1210, the power monitoring devices 80-1-80-2 can treat the voltage sine waves of the main power supply TP and the second power supply P2 as synchronization test signals to carry out the synchronization operation. FIG. 13 is a diagram illustrating the time synchronization in step S1210. As shown in FIG. 13, there is a time interval ΔT between the voltage wave VW1 detected by the power monitoring device 80-1 at the main power supply TP and the voltage wave VW2 detected by the power monitoring device 80-2 at the second power supply P2. Thus, the power monitoring device 80-2 synchronizes with the power monitoring device 80-1 according to the time interval ΔT. Herein it should be noted that the synchronization test signals are not limited to voltage sine waves, and which may also be voltage signals, current signals, or digital signals transmitted via a PLC network. A signal can be considered a synchronization test signal as long as it allows the power monitoring devices 80-1-80-2 to synchronize with each other.

Figure 14:
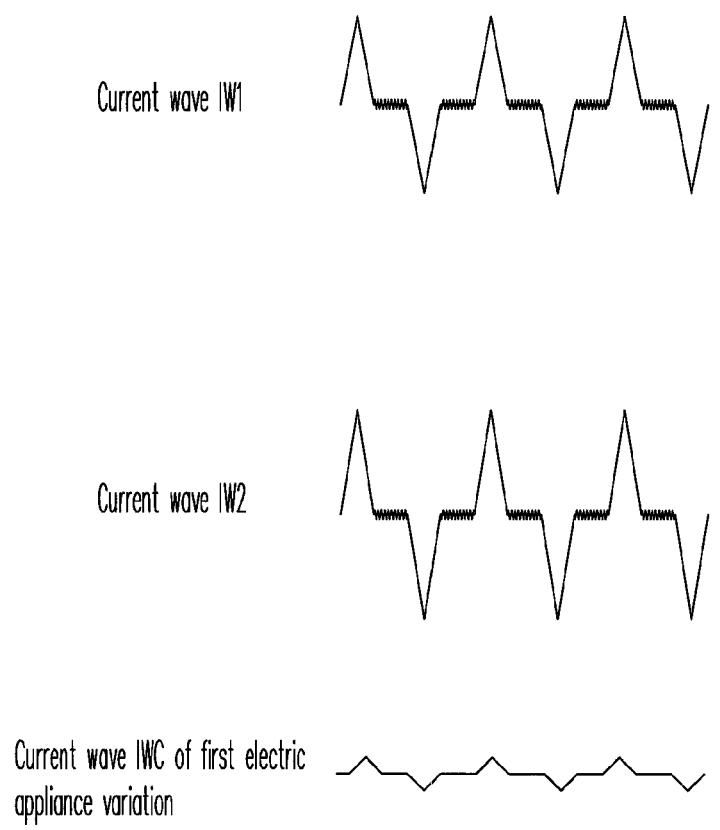
FIG. 14 is a diagram illustrating a first variation, a second variation, and a first electric appliance variation in step S1220.

FIG. 14 is a diagram illustrating a first variation, a second variation, and a first electric appliance variation in step S1220. Referring to FIGS. 10A, 11, and 14, in step S1220, the power monitoring device 80-1 receives the second variation (in FIG. 14, the second variation is a current wave IW2; however, the invention is not limited thereto, and the second variation may also be any other value related to the power consumption feature) detected by the power monitoring device 80-2 and calibrates the waveforms of the first variation (in FIG. 14, the first variation is the current wave IW1; however, the invention is not limited thereto) and the second variation through shifting. Due to current drifting and time synchronization accuracy problem, there may still be slight time difference between the current waves IW1-IW2. Thus, in step S1220, the current waves IW1-IW2 are slightly shifted to eliminate the time difference between the two.

In other embodiments, the power monitoring device 80-2 may also transmit the time interval ΔT mentioned in step S1210 to the power monitoring device 80-1 along with the second variation. Thus, the power monitoring device 80-1 can shift the current waves IW1-IW2 in step S1220 by using the time interval ΔT, so as to perform time synchronization. On the other hand, in step S1230, the power monitoring device 80-1 on the upper level subtracts the current wave IW2 from the calibrated current wave IW1 to generate a net current wave IWC of the first electric appliance variation, so as to execute steps S1150-S1160 in FIG. 11. The steps S1150-S1160 have been described in foregoing embodiment therefore will not be described herein.

Figure 15:
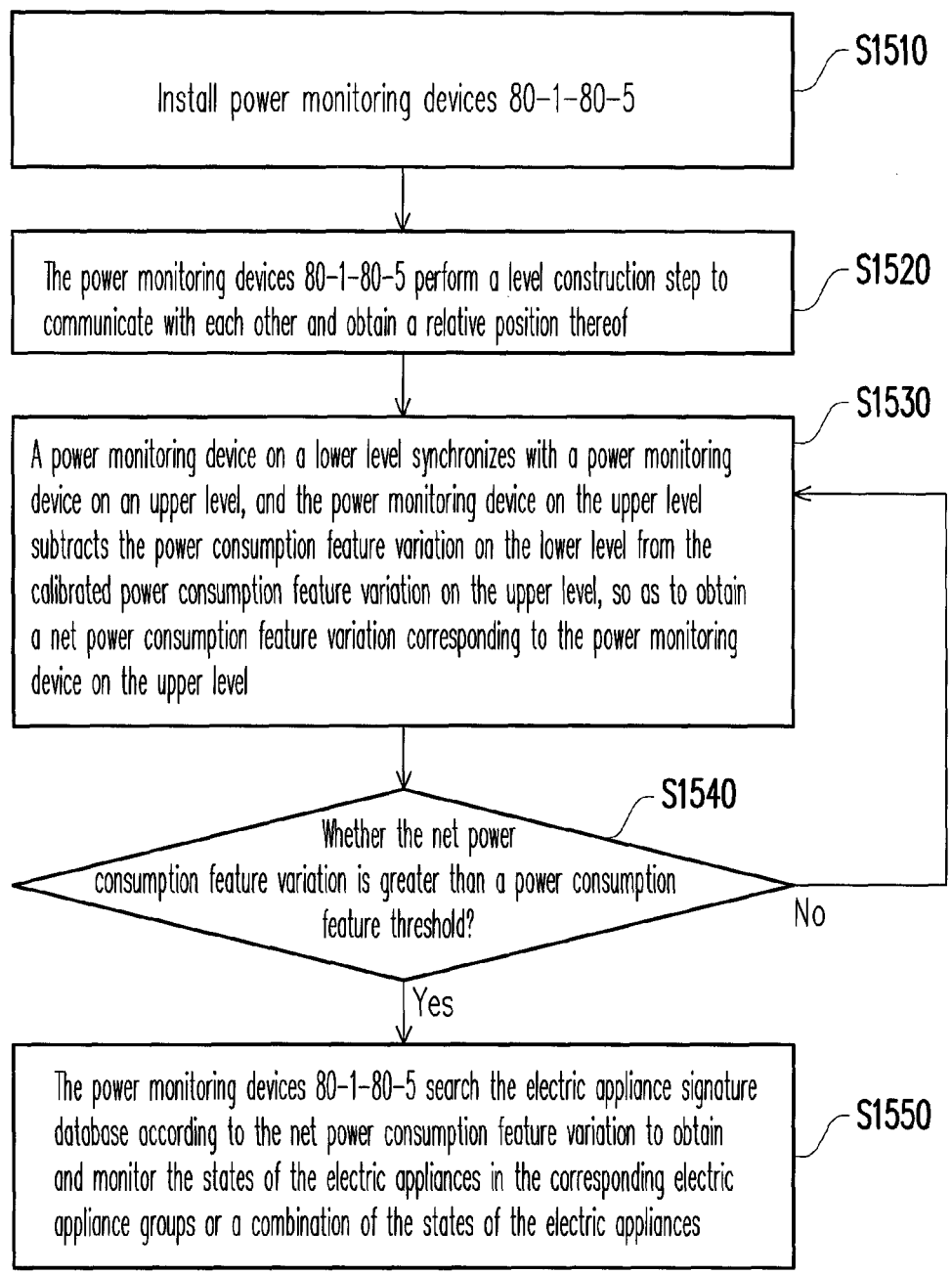
FIG. 15 is a flowchart of a power monitoring method for identifying the state of an electric appliance according to the third embodiment of the invention.

The third embodiment will be further described with reference to foregoing first, second, and fourth embodiments and FIGS. 8 and 15. FIG. 15 is a flowchart of a power monitoring method for identifying the state of an electric appliance according to the third embodiment of the invention. First, in step S1510, the power monitoring devices 80-1-80-5 are installed in the power monitoring system 800. In the present embodiment, the power monitoring devices 80-1-80-5 respectively samples the power consumption features of the main power supply TP and the second, third, fourth, and fifth power supplies P2-P5 to generate corresponding first, second, third, fourth, and fifth variations.

Figure 9:
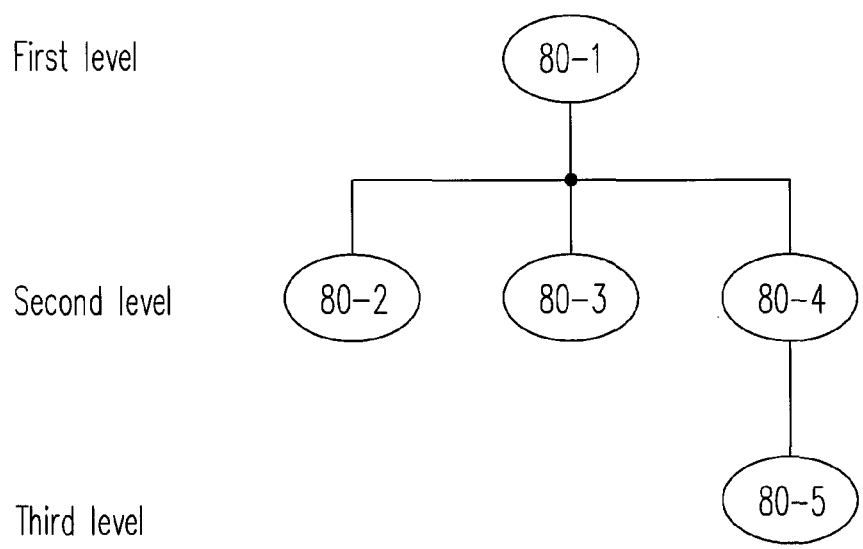
FIG. 9 is a diagram of an electricity meter topology network in FIG. 8.

Then, in step S1520, the power monitoring devices 80-1-80-5 perform a level construction step to communicate with each other, so as to obtain the relative position thereof and establish an electricity meter topology network. FIG. 9 is a diagram of the electricity meter topology network in FIG. 8. Herein the power monitoring device 80-1 is referred to as a first level power monitoring device, the power monitoring devices 80-2-80-4 are referred to as second level power monitoring devices, and the power monitoring device 80-5 is referred to as a third level power monitoring device.

In order to obtain and monitor the state of the corresponding electric appliance group, in step S1530, a power monitoring device on a lower level synchronizes with a power monitoring device on an upper level, and the power monitoring device on the upper level subtracts the variation of the power consumption feature on the lower level from the variation of the calibrated power consumption feature on the upper level, so as to obtain a net power consumption feature variation corresponding to the power monitoring device on the upper level.

For example, in step S1530, the third level power monitoring device 80-5 and the second level power monitoring device 80-4 synchronize with each other to calibrate the power consumption feature variation (i.e., the fourth variation) of the fourth power supply P4 and the power consumption feature variation (i.e., the fifth variation) of the fifth power supply P5. Besides, the second level power monitoring device 80-4 receives the fifth variation of the third level power monitoring device 80-5 and subtracts the fifth variation from the calibrated fourth variation to generate a net power consumption feature variation of the electric appliance 110-4 in the electric appliance group G4.

Additionally, the second level power monitoring devices 80-2-80-4 also synchronize with the first level power monitoring device 80-1 so as to calibrate the first variation and the fourth variation. Besides, the first level power monitoring device 80-1 first receives the second variation, the third variation, and the fourth variation from the second level power monitoring devices 80-2-80-4 and adds foregoing variations up. Then, the first level power monitoring device 80-1 subtracts forgoing sum from the calibrated first variation to obtain a net power consumption feature variation (i.e., the first electric appliance variation mentioned in the fourth embodiment) of the electric appliance 110-1 in the electric appliance group G1. The power monitoring devices 80-2, 80-3, and 80-5 then respectively obtain the power consumption feature variations of the electric appliances 110-2, 110-3, and 110-5 in the electric appliance groups G2, G3, and G5 through the method described in the first embodiment or the second embodiment.

Thereby, the power monitoring devices 80-1-80-5 determine whether the net power consumption feature variation is greater than a power consumption feature threshold (step S1540). In step S1550, the power monitoring devices 80-1-80-5 search the electric appliance signature database according to the net power consumption feature variation to obtain and monitor the states of the electric appliances 110-1-110-5 in the electric appliance groups G1-G5 or a combination of the states of the electric appliances 110-1-110-5. Step S1540 and step S1550 are similar to step S1150 and step S1160 in FIG. 11 therefore will not be described herein. Additionally, other detailed procedures in the present embodiment have been described in foregoing embodiments therefore will not be described herein either.

When foregoing third and fourth embodiments are implemented, due to the problem of transmission bandwidth, a power monitoring device on a lower level needs to perform other power monitoring operations (for example, identify the state of an electric appliance by using a remote search module and synchronize with a power monitoring device on an upper level, etc) besides transmitting the detected power consumption feature variation to a power monitoring device on an upper level. Thus, the power consumption feature variation can be transmitted in a time-sharing manner. In other words, the power monitoring device on the lower level can record a section of a power consumption feature variation (for example, one to two seconds of the power consumption feature variation) and transmits it to the upper level during each period (for example, each minute), so at to accomplish the distributed power monitoring system in foregoing third or fourth embodiment. During the rest time of each period, the power monitoring device on the lower level performs other power monitoring operations by using the bandwidth.

In summary, in an embodiment of the invention, when the state of an electric appliance changes, a corresponding variation of the power consumption feature of the electric appliance is produced. Accordingly, associations between electric appliances, states of the electric appliances, and variations of the power consumption features of the electric appliances (i.e., an electric appliance signature database) are established with user feedbacks. Then, in an embodiment of the invention, the electric appliance signature database is searched according to a variation of a power consumption feature (for example, voltage, current, power, harmonic wave information of the current, and transient current wave produced when an electric appliance switches states) of a monitored power supply, so as to identify the state of an electric appliance to which the monitored power supply supplies electric power. Thereby, the power consumption of each electric appliance can be recorded according to the variation of the state of the electric appliance, and accordingly a user can conveniently determine the power consumption cause and reduce the power consumption.

Additionally, in an embodiment of the invention, a large electric appliance signature database and a highly efficient database searching capability are provided through the Internet and the cloud computing technology such that a user can record the brand, model, power consumption cause, and power-saving suggestions of his/her electric appliances into the electric appliance signature database. Accordingly, such functions as a more specific power saving and management plan, automatic power consumption cause judgment, power consumption distribution analysis, and automatic power saving control can be achieved. On the other hand, a distributed or tiered power monitoring system can be established by using multiple power monitoring devices such that the power monitoring devices on each level can monitor the corresponding electric appliance group. Thereby, the operation load of each power monitoring device can be distributed.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A power monitoring system for identifying a state of an electric appliance, comprising:
    a first power monitoring device, for measuring a power consumption feature of a first power supply, so as to detect and calculate a first variation of the power consumption feature of the first power supply, wherein the first power supply supplies electric power to a first electric appliance group and a second electric appliance group; and
    at least one second power monitoring device, for measuring a power consumption feature of a corresponding second power supply, so as to detect and calculate a second variation of the power consumption feature of the second power supply, wherein the second power supply is a branch of the first power supply and supplies electric power to the second electric appliance group,
    wherein the first power monitoring device and the second power monitoring device perform a level construction step to obtain a relative position between the first power monitoring device and the second power monitoring device and synchronously calibrate the first variation and the second variation to calculate a first electric appliance variation, when the first electric appliance variation is detected, the first power monitoring device searches an electric appliance signature database according to the first electric appliance variation to obtain and monitor states of a plurality of first electric appliances corresponding to the first electric appliance variation or a combination of the states of the first electric appliances, wherein the first electric appliance group comprise the first electric appliances.

2. The power monitoring system according to claim 1, wherein the first power monitoring device and the second power monitoring device perform the level construction step by using a power line communication network to obtain the relative position, so as to obtain an electricity meter topology network.

3. The power monitoring system according to claim 1, wherein the second power monitoring device generates a meter consumption load at the second power supply, and the first power monitoring device receives the meter consumption load at the first power supply to obtain a position of the second power monitoring device, so that the first power monitoring device and the second power monitoring device perform the level construction step and generate an electricity meter topology network.

4. The power monitoring system according to claim 1, wherein the first power monitoring device and the second power monitoring device compare a synchronization test signal in the first power supply and the second power supply to generate a time interval, so as to synchronize the first power monitoring device and the second power monitoring device or synchronously calibrate the first variation and the second variation.

5. The power monitoring system according to claim 4, wherein the synchronization test signal is a voltage sine wave.

6. The power monitoring system according to claim 1, wherein the first variation is a first current wave of the first power supply, the second variation is a second current wave of the second power supply, and the first electric appliance variation is a net current wave generated by shifting the first current wave and then subtracting the second current wave.

7. The power monitoring system according to claim 1 further comprising:
    at least one third power monitoring device, for measuring a power consumption feature of a corresponding third power supply, so as to detect and calculate a third variation of the power consumption feature of the third power supply, wherein the third power supply is a branch of the second power supply and supplies electric power to a third electric appliance group,
    wherein the second power monitoring device receives the third variation and synchronously calibrates the second variation and the third variation to calculate a second electric appliance variation, when the second electric appliance variation is detected, the second power monitoring device searches the electric appliance signature database according to the second electric appliance variation to obtain and monitor states of a plurality of second electric appliances corresponding to the second electric appliance variation or a combination of the states of the second electric appliances, wherein the second electric appliance group comprises the second electric appliances.

8. A power monitoring method for identifying a state of an electric appliance, comprising:

configuring a first power monitoring device for measuring a power consumption feature of a first power supply, so as to detect and calculate a first variation of the power consumption feature of the first power supply, wherein the first power supply supplies electric power to a first electric appliance group and a second electric appliance group;

configuring at least one second power monitoring device for measuring a power consumption feature of a corresponding second power supply, so as to detect and calculate a second variation of the power consumption feature of the second power supply, wherein the second power supply is a branch of the first power supply and supplies electric power to the second electric appliance group;

performing a level construction step by using the first power monitoring device and the second power monitoring device to obtain a relative position between the first power monitoring device and the second power monitoring device;

synchronously calibrating the first variation and the second variation to calculate a first electric appliance variation;

when the first electric appliance variation is detected, searching an electric appliance signature database according to the first electric appliance variation to obtain and monitor states of a plurality of first electric appliances corresponding to the first electric appliance variation or a combination of the states of the first electric appliances, wherein the first electric appliance group comprises the first electric appliances.

9. The power monitoring method according to claim 8, wherein the level construction step comprises:

communicating with each other by using a wired network, a wireless network, or a PLC network to obtain positions of a plurality of neighboring power monitoring devices, so as to obtain an electricity meter topology network.

10. The power monitoring method according to claim 8, wherein the level construction step comprises:

generating a meter consumption load at the second power supply by using the second power monitoring device, and receiving the meter consumption load at the first power supply by using the first power monitoring device to obtain a position of the second power monitoring device, so as to generate an electricity meter topology network.

11. The power monitoring method according to claim 8, wherein the step of synchronously calibrating the first variation and the second variation to calculate the first electric appliance variation comprises:

comparing a synchronization test signal in the first power supply and the second power supply by using the first power monitoring device and the second power monitoring device to generate a time interval, so as to synchronize the first power monitoring device and the second power monitoring device;

shifting a current wave of the first variation or the second variation to calibrate time of the first variation and time of the second variation; and calculating a difference between the shifted first variation and the second variation to generate the first electric appliance variation.

12. The power monitoring method according to claim 11, wherein the first variation is a first current wave of the first power supply, the second variation is a second current wave of the second power supply, and the first electric appliance variation is a net current wave generated by shifting the first current wave and then subtracting the second current wave.

13. The power monitoring method according to claim 8, wherein the step of detecting the first electric appliance variation comprises:

when the first electric appliance variation is greater than a threshold, searching an electric appliance signature database according to the first electric appliance variation to obtain and monitor the states of the first electric appliances corresponding to the first electric appliance variation.

14. The power monitoring method according to claim 8, wherein the first power supply and the second power supply further supply electric power to a third electric appliance group, and the power monitoring method further comprises:

configuring a third power monitoring device for measuring a power consumption feature of a corresponding third power supply, so as to detect and calculate a third variation of the power consumption feature of the third power supply, wherein the third power supply is a branch of the second power supply and supplies electric power to the third electric appliance group;

after the second power monitoring device and the third power monitoring device obtains a relative position between the second power monitoring device and the third power monitoring device, synchronously calibrating the second variation and the third variation to calculate a second electric appliance variation; and when the second electric appliance variation is detected, searching the electric appliance signature database according to the second electric appliance variation to obtain and monitor states of a plurality of second electric appliances corresponding to the second electric appliance variation or a combination of the states of the second electric appliances, wherein the second electric appliance group comprises the second electric appliances.

* * * * *